United States Patent
Lin et al.

(10) Patent No.: US 10,991,630 B2
(45) Date of Patent: Apr. 27, 2021

(54) SEMICONDUCTOR DEVICE AND METHOD

(71) Applicant: Taiwan Semiconductor Manufacturing Company, Ltd., Hsinchu (TW)

(72) Inventors: Tzu-Ching Lin, Hsinchu (TW); Chien-Chih Lin, Taichung (TW); Feng-Ching Chu, Pingtung (TW); Tuoh Bin Ng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/526,163

(22) Filed: Jul. 30, 2019

(65) Prior Publication Data
US 2020/0105621 A1   Apr. 2, 2020

Related U.S. Application Data
(60) Provisional application No. 62/737,455, filed on Sep. 27, 2018.

(51) Int. Cl.
| H01L 21/8238 | (2006.01) |
| H01L 27/092 | (2006.01) |
| H01L 29/08 | (2006.01) |
| H01L 29/66 | (2006.01) |
| H01L 29/10 | (2006.01) |

(52) U.S. Cl.
CPC ............. *H01L 21/823821* (2013.01); *H01L 21/823814* (2013.01); *H01L 27/0924* (2013.01); *H01L 29/0847* (2013.01); *H01L 29/1054* (2013.01); *H01L 29/6681* (2013.01)

(58) Field of Classification Search
CPC ..... H01L 21/823821; H01L 21/823814; H01L 21/0262
See application file for complete search history.

(56) References Cited

U.S. PATENT DOCUMENTS

| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |

(Continued)

*Primary Examiner* — Shih Tsun A Chou
(74) *Attorney, Agent, or Firm* — Slater Matsil, LLP

(57) ABSTRACT

In an embodiment, a method includes: forming a first gate stack and a second gate stack on a fin; etching the fin to form a recess in the fin between the first gate stack and the second gate stack; forming an epitaxial source/drain region in the recess, the forming including: forming a first layer lining sides and a bottom of the recess by dispensing silane, dichlorosilane, trichlorosilane, and hydrochloric acid in the recess; and after forming the first layer, forming a second layer on the first layer by dispensing the silane, dichlorosilane, trichlorosilane, and hydrochloric acid in the recess, where each of the silane, dichlorosilane, trichlorosilane, and hydrochloric acid are dispensed at a first flow rate when forming the first layer and at a second flow rate when forming the second layer.

20 Claims, 21 Drawing Sheets

(56) References Cited

U.S. PATENT DOCUMENTS

| | | | |
|---|---|---|---|
| 9,859,380 B2 | 1/2018 | Lee et al. | |
| 2011/0287600 A1* | 11/2011 | Cheng | H01L 21/823425 |
| | | | 438/299 |
| 2016/0284597 A1* | 9/2016 | Tsai | H01L 21/324 |
| 2018/0151698 A1* | 5/2018 | Sung | H01L 21/3065 |
| 2019/0341472 A1* | 11/2019 | Lee | H01L 29/6656 |
| 2020/0105606 A1* | 4/2020 | Lin | H01L 21/02576 |

* cited by examiner

SEMICONDUCTOR DEVICE AND METHOD

PRIORITY CLAIM AND CROSS-REFERENCE

This application claims the benefit of U.S. Provisional Application No. 62/737,455, filed on Sep. 27, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
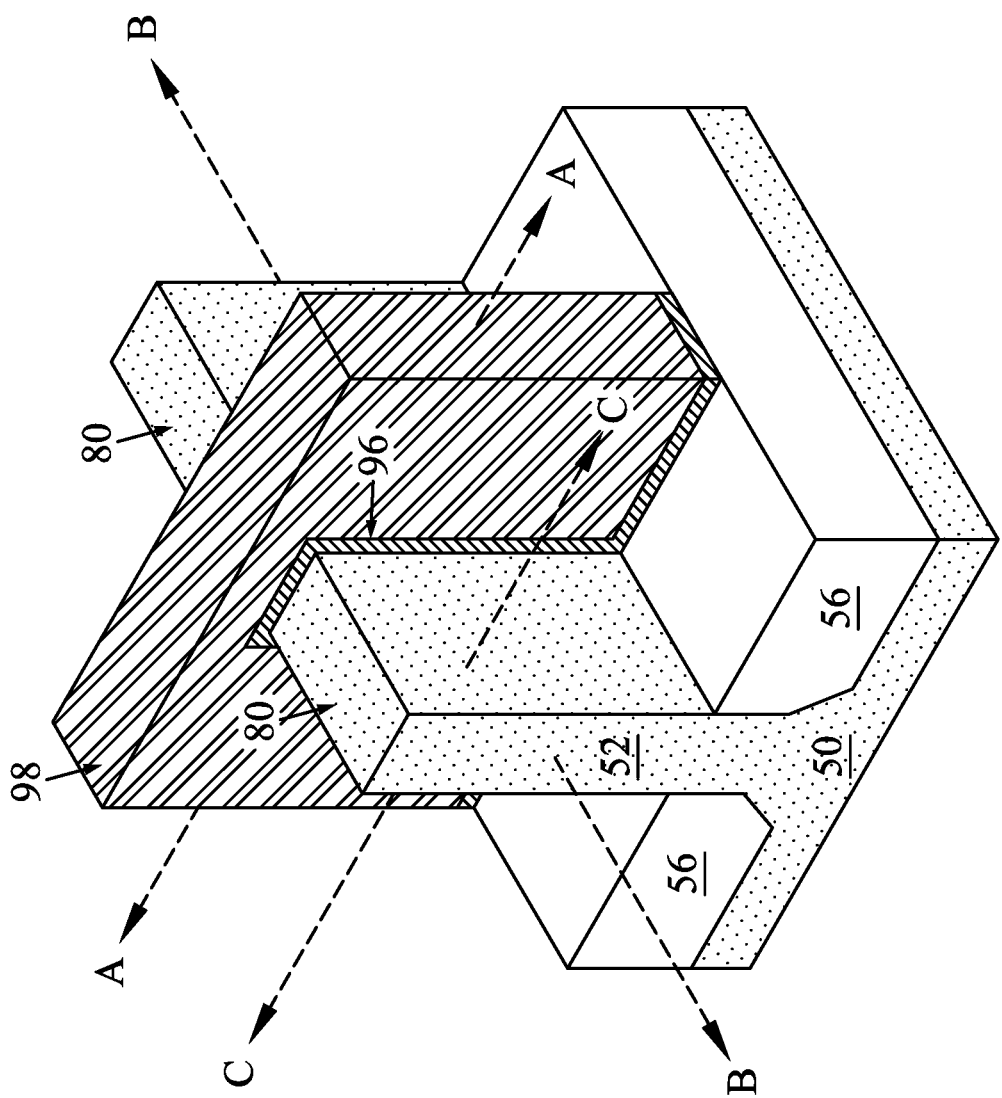
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiment, an epitaxial source/drain region is formed with a plurality of epitaxial growth processes. During the epitaxial growth processes, a same set of semiconductor material precursors are dispensed. The precursors are dispensed at different flow-rate ratios in the different growth processes. By adjusting the flow-rate ratios, more gas-phase chlorine atoms may be introduced at the beginning of the epitaxial growth, and less gas-phase chlorine atoms may be introduced at the end of the epitaxial growth. The upper layers of the resulting epitaxial source/drain regions may thus have a taller and slimmer profile, reducing the gate-to-source/drain capacitance of the resulting FinFETs.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 96 is along sidewalls and over a top surface of the fin 52, and a gate electrode 98 is over the gate dielectric layer 96. Source/drain regions 80 are disposed in opposite sides of the fin 52 with respect to the gate dielectric layer 96 and gate electrode 98. FIG. 1 further illustrates reference cross-sections that are used in later figures. Cross-section A-A is along a longitudinal axis of the gate electrode 98 and in a direction, for example, perpendicular to the direction of current flow between the source/drain regions 80 of the FinFET. Cross-section B-B is perpendicular to cross-section A-A and is along a longitudinal axis of the fin 52 and in a direction of, for example, a current flow between the source/drain regions 80 of the FinFET. Cross-section C-C is parallel to cross-section A-A and extends through a source/drain region 80 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 20B are cross-sectional views of intermediate stages in the manufacturing of FinFETs, in accordance with some embodiments. FIGS. 2, 3, 4, 5, 6, 7, 8A, 9A, 10A, 15A, 16A, 17A, 18A, 19A, and 20A are illustrated along reference cross-section A-A in FIG. 1, except for multiple fins/FinFETs. FIGS. 8B, 9B, 10B, 11, 12, 13, 14, 15B, 16B, 17B, 18B, 18C, 19B, and 20B are illustrated along reference cross-section B-B in FIG. 1. FIG. 14 is illustrated along reference cross-section C-C in FIG. 1.

Figure 2:
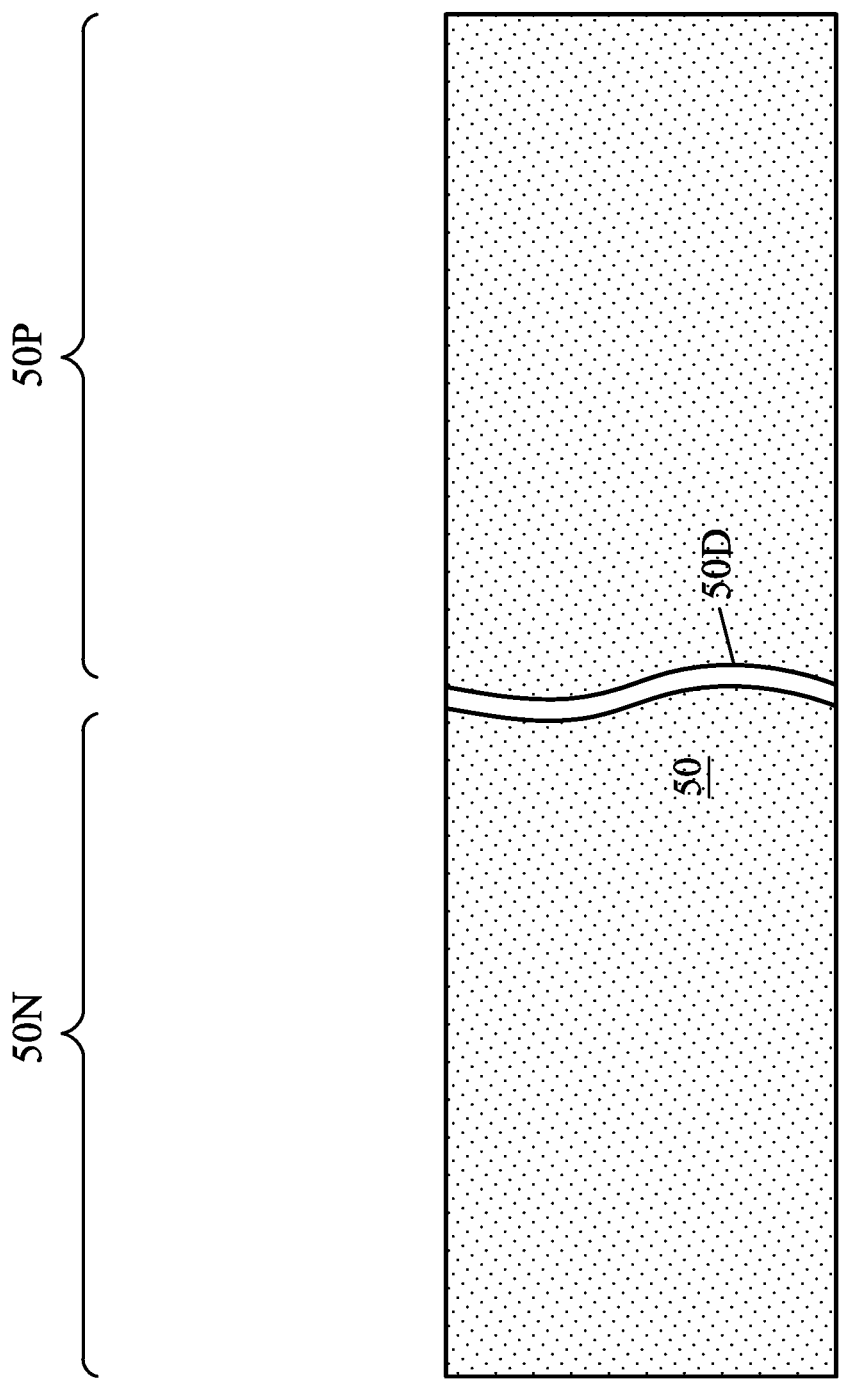
FIGS. 2, 3, 4, 5, 6, 7, 8A, 8B, 9A, 9B, 10A, 10B, 11, 12, 13, 14, 15A, 15B, 16A, 16B, 17A, 17B, 18A, 18B, 18C, 19A, 19B, 20A, and 20B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 50D), and any number of device features (e.g., other active devices, doped regions, isolation structures, etc.) may be disposed between the region 50N and the region 50P.

Figure 3:
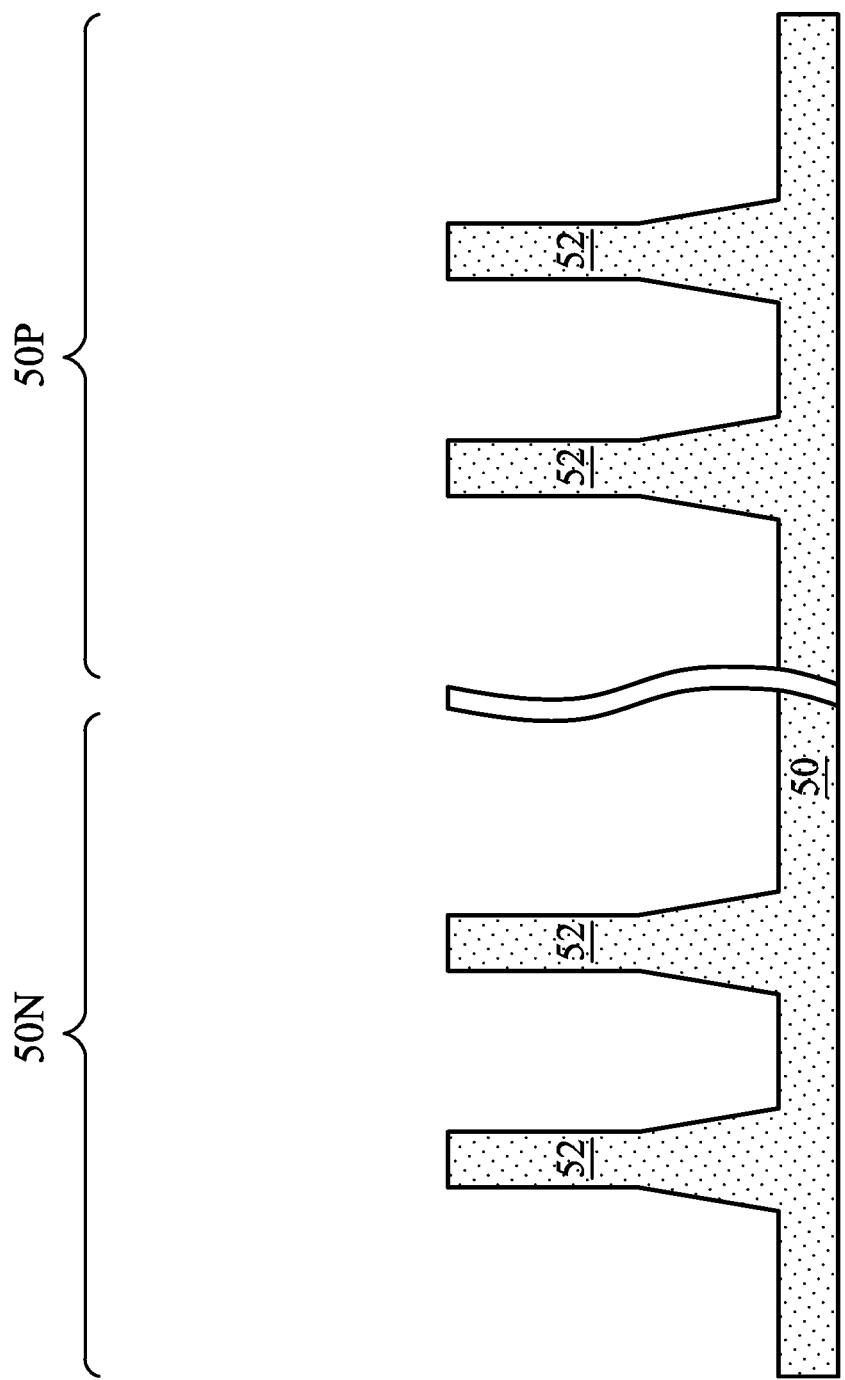

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
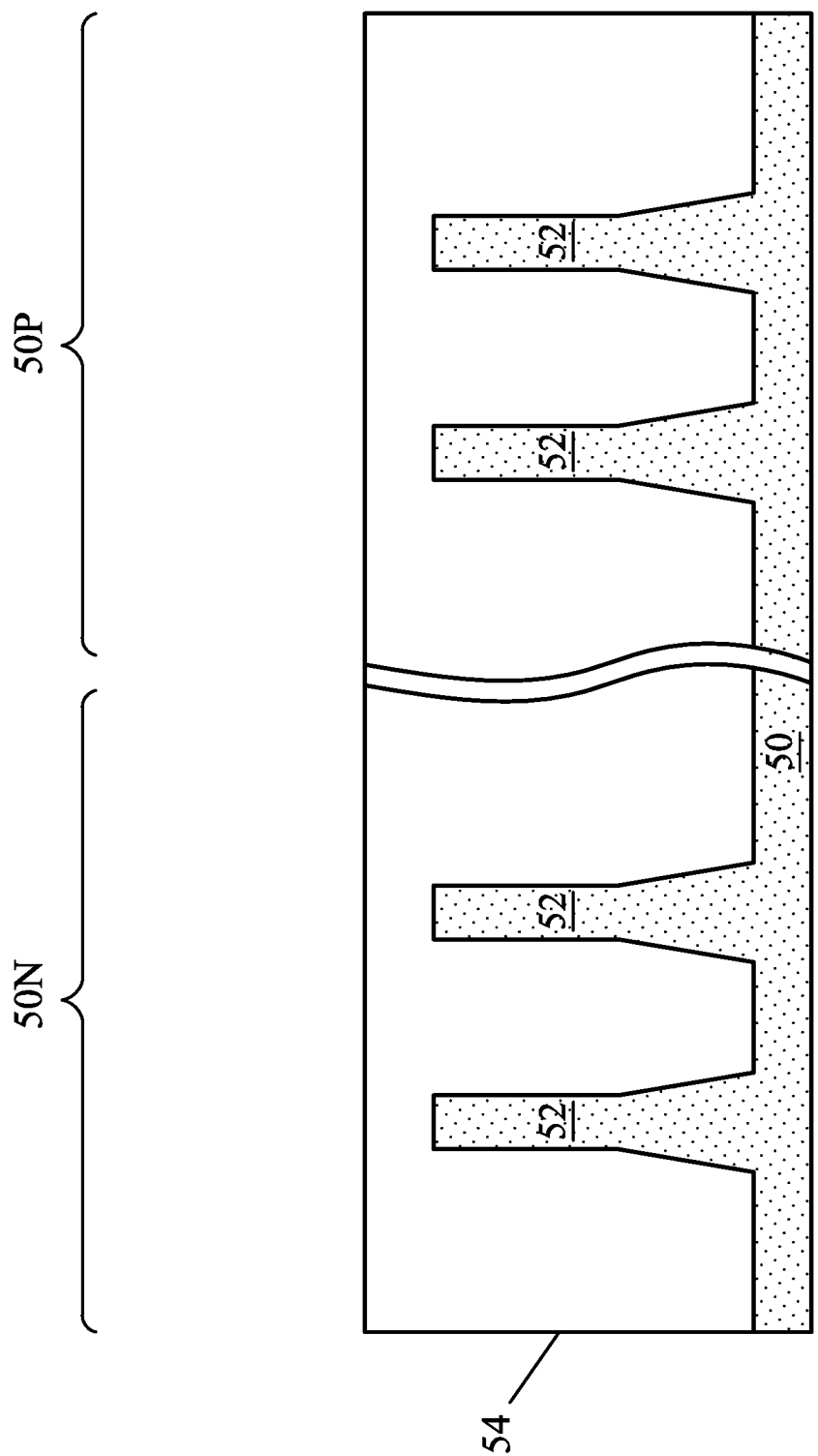

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
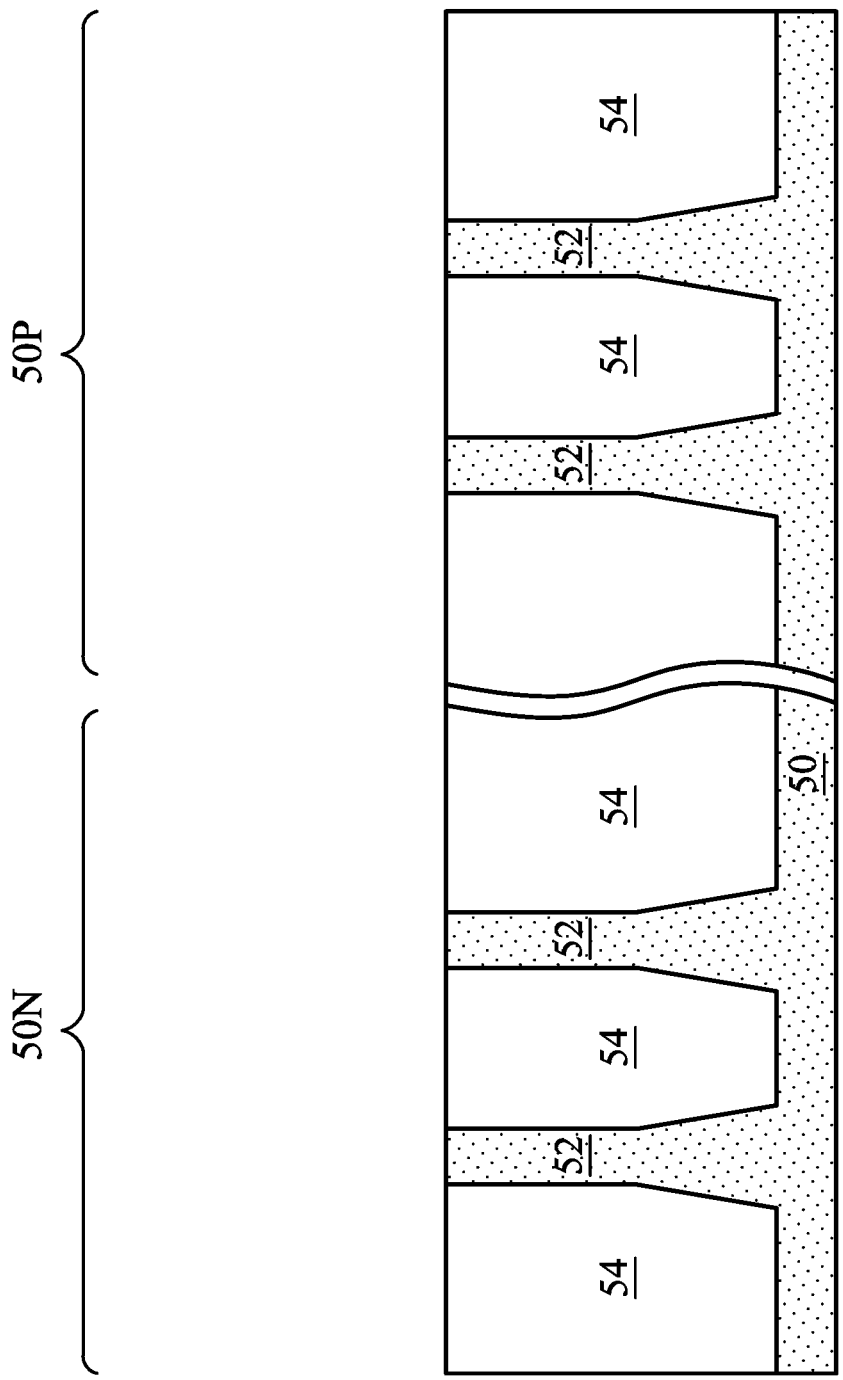

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
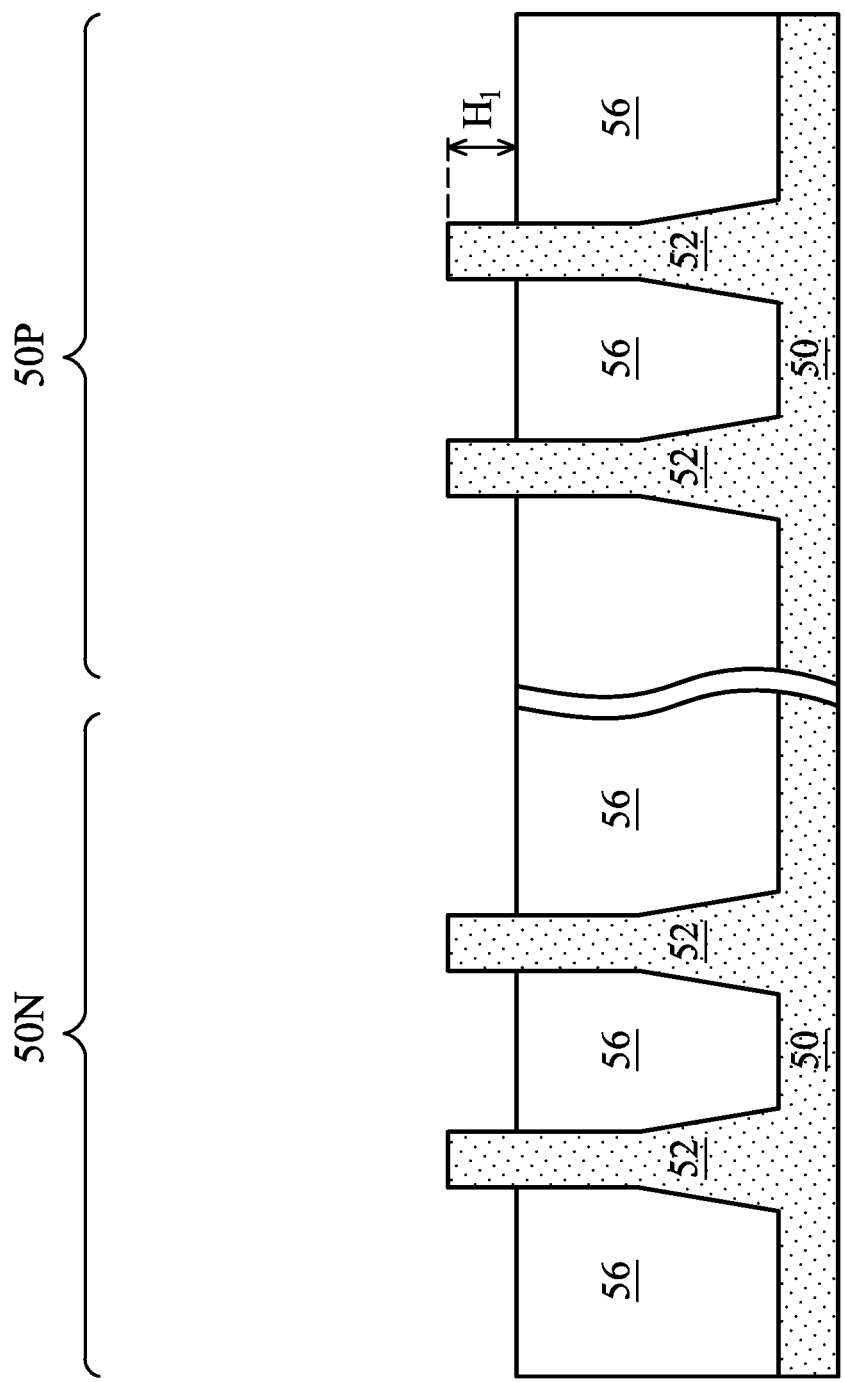

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. After the recessing, exposed portions of the fins 52 extend a height $H_1$ above top surfaces of the STI regions 56. In some embodiments, the height $H_1$ is in the range of from about 20 nm to about 70 nm. The exposed portions of the fins 52 include will be channel regions 58 of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, BF$_2$, indium, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
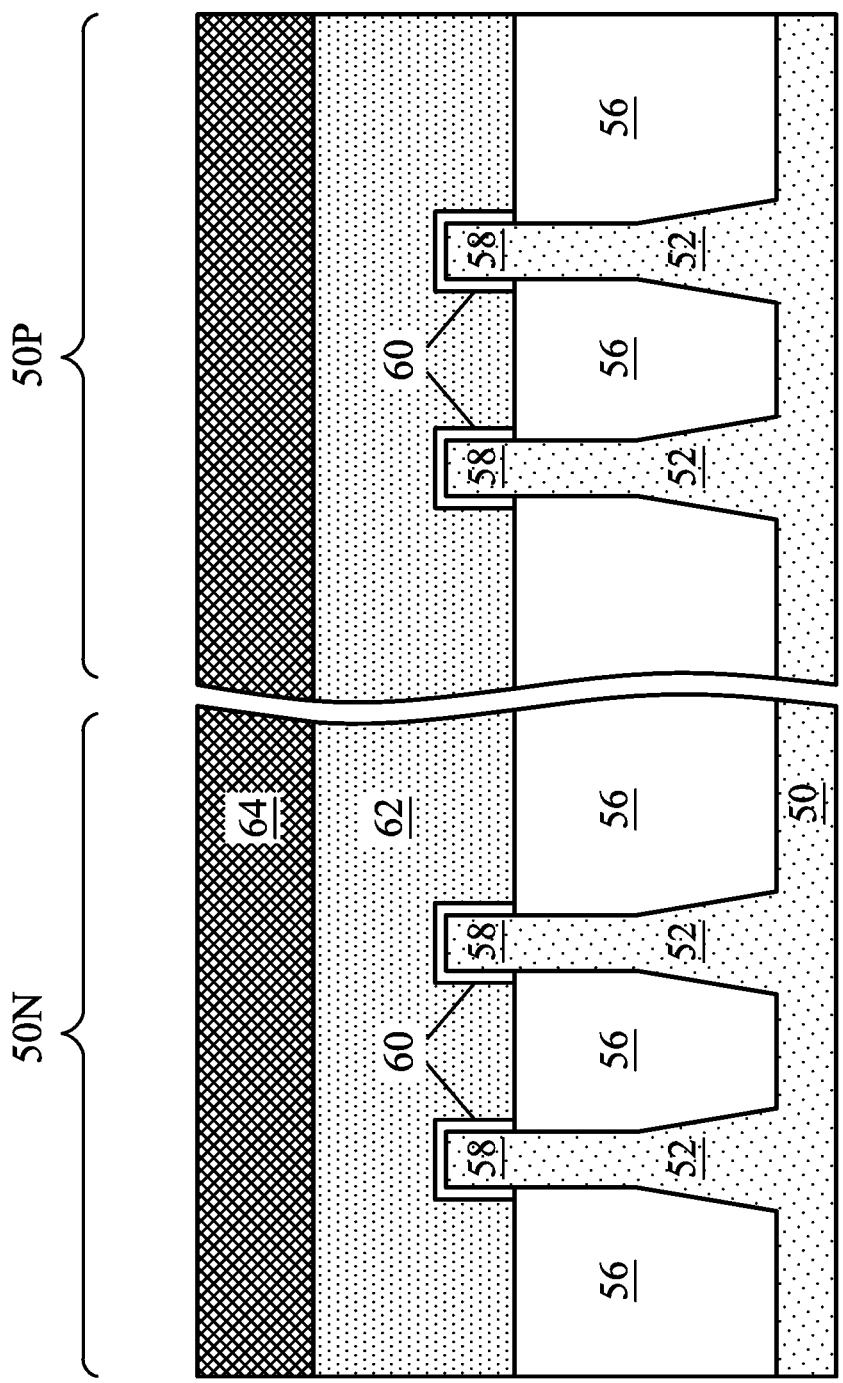

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 20B illustrate various additional steps in the manufacturing of embodiment devices. FIGS. 8A through 20B illustrate features in either of the region 50N and the region 50P. For example, the structures illustrated in FIGS. 8A through 20B may be applicable to both the region 50N and the region 50P. Differences (if any) in the structures of the region 50N and the region 50P are described in the text accompanying each figure.

Figure 8B:
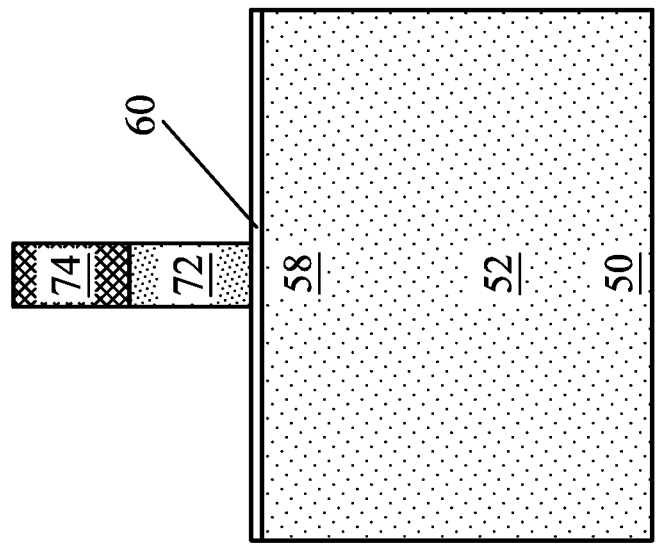
Figure 8A:
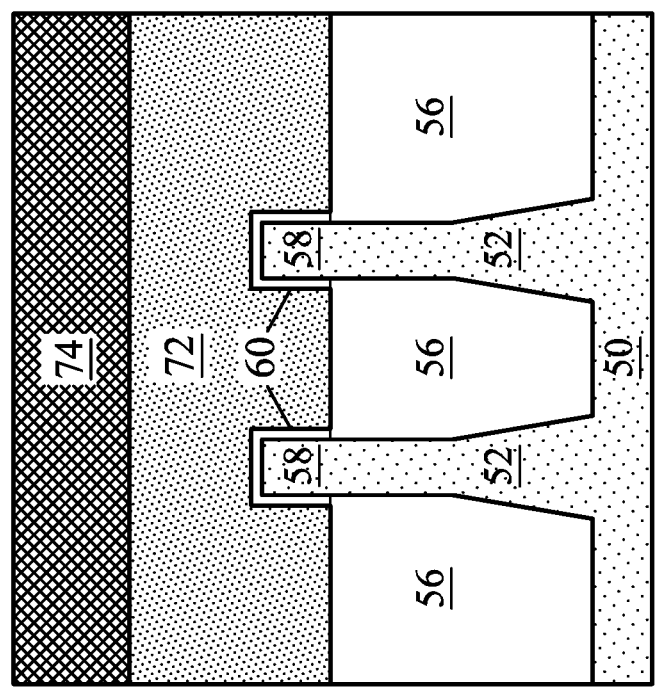

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Figure 9B:
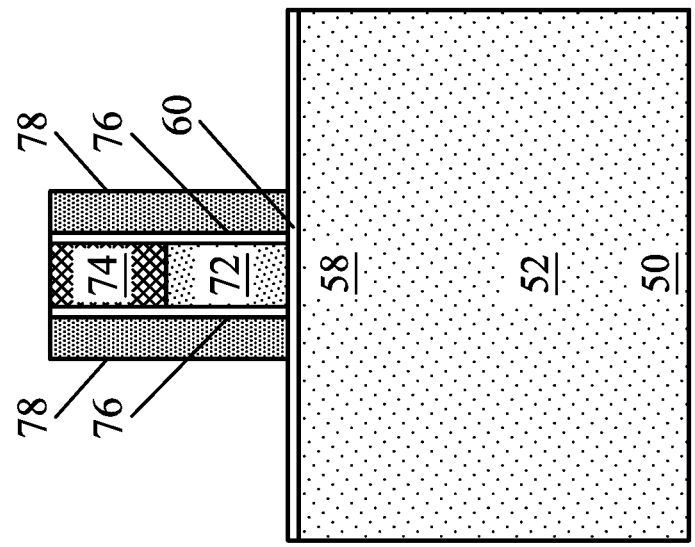
Figure 9A:
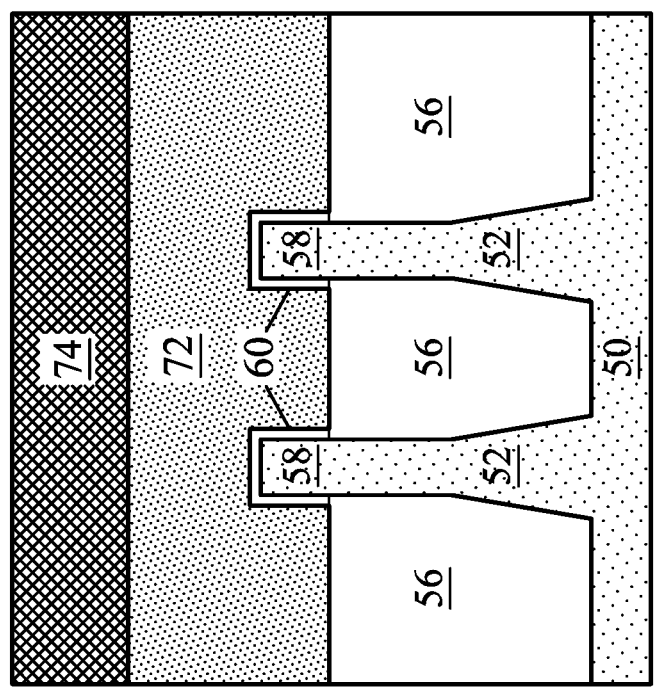

In FIGS. 9A and 9B, gate seal spacers 76 are formed on exposed surfaces of the dummy gates 72, the masks 74, and/or the fins 52. A thermal oxidation or a deposition followed by an anisotropic etch may form the gate seal spacers 76.

After the formation of the gate seal spacers 76, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further, gate spacers 78 are formed on the gate seal spacers 76 along sidewalls of the dummy gates 72 and the masks 74. The gate spacers 78 may be formed by conformally depositing an insulating material and subsequently anisotropically etching the insulating material. The insulating material of the gate spacers 78 may be silicon nitride, SiCN, a combination thereof, or the like.

Figure 10B:
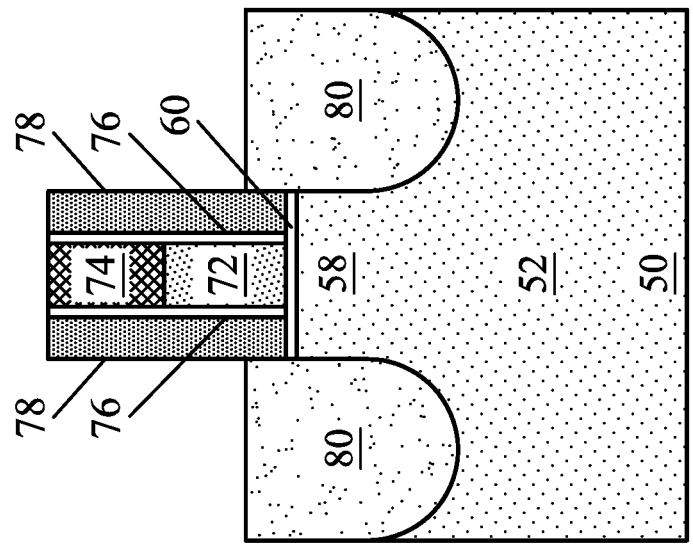
Figure 10A:
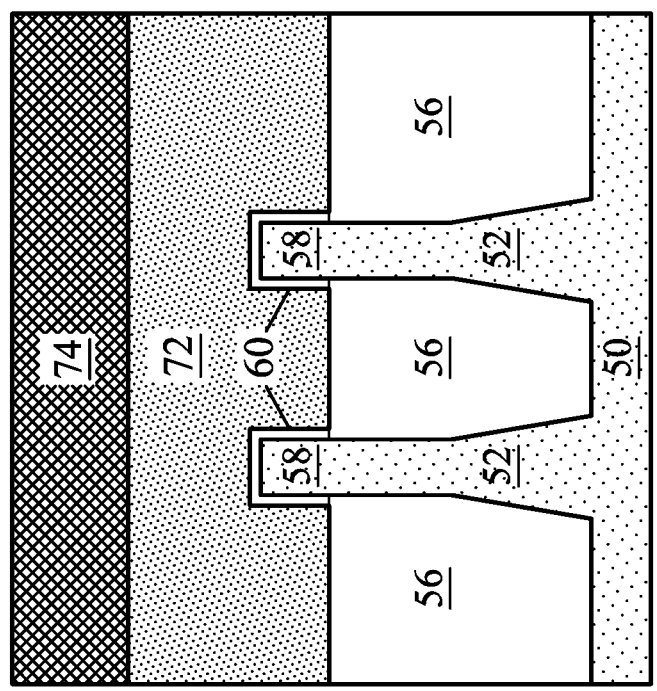

In FIGS. 10A and 10B epitaxial source/drain regions 80 are formed in the fins 52 to exert stress in the respective channel regions 58, thereby improving performance. The epitaxial source/drain regions 80 are formed in the fins 52 such that each dummy gate 72 is disposed between respective neighboring pairs of the epitaxial source/drain regions 80. In some embodiments the epitaxial source/drain regions 80 may extend into, and may also penetrate through, the fins 52. In some embodiments, the gate spacers 78 are used to separate the epitaxial source/drain regions 80 from the dummy gates 72 by an appropriate lateral distance so that the epitaxial source/drain regions 80 do not short out subsequently formed gates of the resulting FinFETs. As discussed further below, the epitaxial source/drain regions 80 are multilayered epitaxial regions that include a plurality of doped semiconductor layers.

FIGS. 11 through 14 are cross-sectional views of intermediate stages in the formation of epitaxial source/drain regions 80. The formation of one epitaxial source/drain region 80 between two dummy gates 72 is illustrated. The illustrated epitaxial source/drain region 80 may be formed in the region 50N or in the region 50P. The epitaxial source/drain regions 80 in the region 50N, e.g., the NMOS region, may be formed by masking the region 50P, e.g., the PMOS region, and performing the steps illustrated in FIGS. 11 through 14. The mask may then be removed. The epitaxial source/drain regions 80 in the region 50P, e.g., the PMOS region, may then be formed by masking the region 50N, e.g., the NMOS region, and performing the steps illustrated in FIGS. 11 through 14. The second mask may then be removed. As discussed further below, the epitaxial source/drain regions 80 are in situ doped with n-type and/or p-type impurities during growth, thus forming source/drain regions. The n-type and/or p-type impurities for source/drain regions may be any of the impurities previously discussed.

Figure 11:
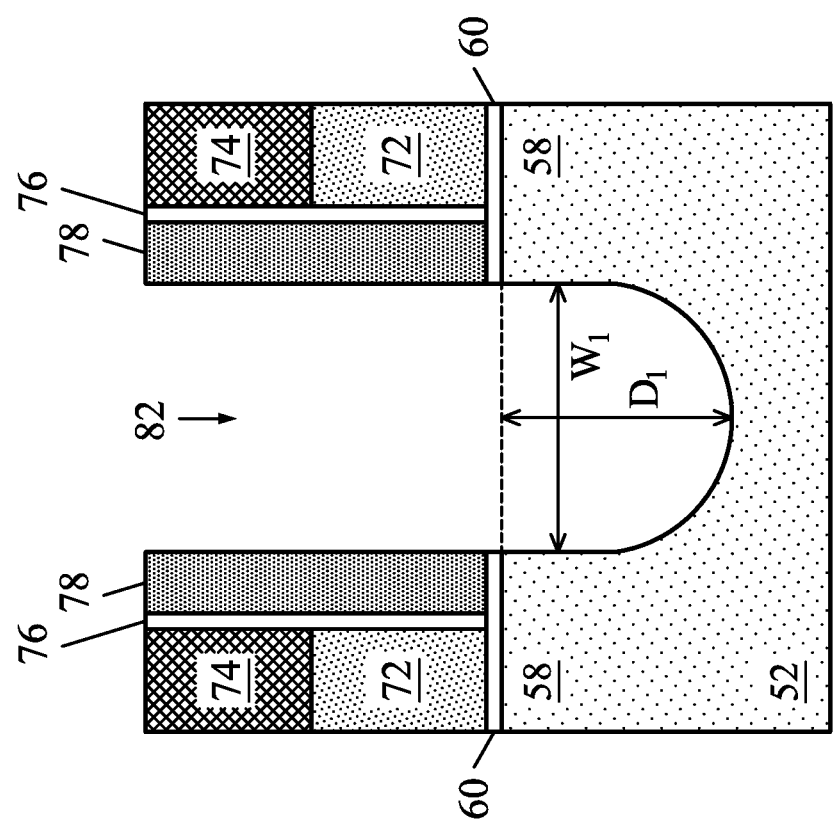

In FIG. 11, recesses 82 are formed in source/drain regions of the fins 52, between neighboring ones of the gate spacers 78. The recesses 82 may be formed using acceptable photolithography and etching techniques. The recesses 82 are formed to a width $W_1$, which is equal to the distance between the neighboring ones of the gate spacers 78. In some embodiments, the width $W_1$ is in the range of from about 20 nm to about 35 nm. The recesses 82 are formed to a depth $D_1$. The depth $D_1$ may be greater than the height $H_1$ (see FIG. 6). In some embodiments, the depth $D_1$ is in the range of from about 35 nm to about 60 nm.

Figure 12:
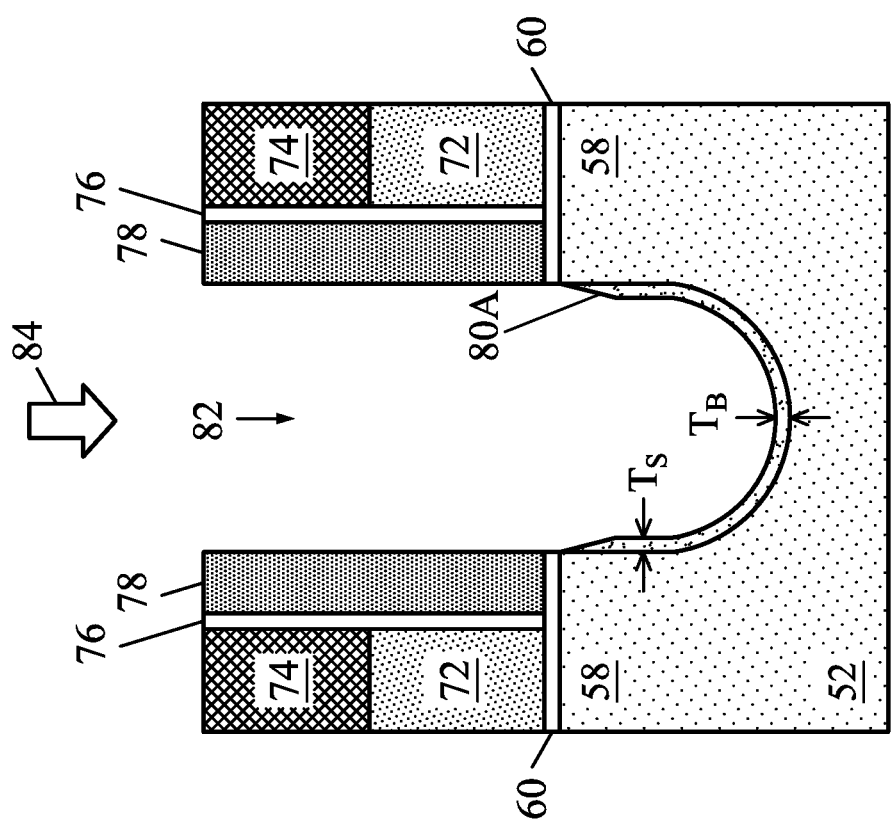

In FIG. 12, a first epitaxial growth process 84 is performed to form first layers 80A of the epitaxial source/drain regions 80 in the recesses 82. During the first epitaxial growth process 84, the recesses 82 are exposed to several precursors. The precursors include a plurality of semiconductor material precursors, a dopant precursor, and an etching precursor.

The semiconductor material precursors are precursors for depositing a desired semiconductor material. For example, in an embodiment where the epitaxial source/drain regions 80 are formed from silicon, the semiconductor material precursors may include silane ($SiH_4$), dichlorosilane (DCS) ($H_2SiCl_2$), disilane (DS) ($Si_2H_6$), trichlorosilane (TCS) ($HSiCl_3$), or the like. Notably, more than one precursor of the same semiconductor material is simultaneously dispensed during the first epitaxial growth process 84. As discussed further below, dispensing more than one precursor of the same semiconductor material allows the material composition of the resulting epitaxial source/drain regions 80 to be controlled, which allows the resulting shape of the epitaxial source/drain regions 80 to be controlled. In some embodiments, the semiconductor material precursors are silane, DCS, and TCS.

It should be appreciated that the precursors may be for any acceptable semiconductor material. In embodiments where the epitaxial source/drain regions 80 are for n-type FinFETs, the semiconductor material may be one that can exert a tensile strain in the channel region, such as silicon. Likewise, in embodiments where the epitaxial source/drain regions 80 are for p-type FinFETs, the semiconductor material may be one that can exert a compressive strain in the channel region, such as silicon germanium.

The dopant precursor is any precursor of a desired conductivity type that complements the semiconductor material precursors. For example, in an embodiment where the epitaxial source/drain regions 80 are silicon doped with phosphorous (SiP), such as when p-type devices are formed, the dopant precursor is a phosphorous precursor such as phosphine ($PH_3$). Likewise, in an embodiment where the epitaxial source/drain regions 80 are silicon doped with boron (SiB), such as when n-type devices are formed, the dopant precursor is a boron precursor such as diborane ($B_2H_6$).

The etching precursor controls growth during the first epitaxial growth process 84. In particular, the etching precursor increases the growth selectivity such that the first layers 80A of the epitaxial source/drain regions 80 grow in desired locations (e.g., in the recesses 82 of the fins 52), and do not grow in undesired locations (e.g., on the isolation regions 56). In some embodiments, the etching precursor is hydrochloric acid (HCl).

During the first epitaxial growth process 84, the intermediate structure is simultaneously exposed to the semiconductor material precursors, the dopant precursor, and the etching precursor. As discussed further below, the precursor flow-rate ratios, temperature, and pressure during the first epitaxial growth process 84 are controlled to influence the material composition of the first layers 80A of the epitaxial source/drain regions 80. The first layers 80A are formed with a low dopant concentration. In some embodiments, the dopant concentration of the first layers 80A is in the range of from about $5*10^{19}$ cm$^{-3}$ to about $2*10^{21}$ cm$^{-3}$. Epitaxial regions of a low dopant concentration may adhere better to the fins 52.

The first epitaxial growth process 84 is performed so that the first layers 80A of the epitaxial source/drain regions 80 are a desired thickness. For example, the first epitaxial growth process 84 may be performed for a first predetermined time period to produce layers of the desired thickness. In some embodiments, a duration of the first epitaxial growth process 84 is in the range from about 30 seconds to about 300 seconds. The first layers 80A may have non-uniform thicknesses. In particular, the first layers 80A have a thickness $T_S$ along sides of the recesses 82, and have a thickness $T_B$ along bottoms of the recesses 82. The sidewall thickness $T_S$ may be less than the bottom thickness $T_B$. In some embodiments, the sidewall thickness $T_S$ is in the range of from about 1 nm to about 8 nm, and the bottom thickness $T_B$ is in the range of from about 1 nm to about 10 nm. The first layers 80A may be thick enough to provide good adhesion to the fins 52 for subsequently-formed layers, but thin enough to ensure that a majority of the epitaxial source/drain regions 80 comprise the subsequently-formed layers (which helps ensure the epitaxial source/drain regions 80 are sufficiently doped).

Figure 13:
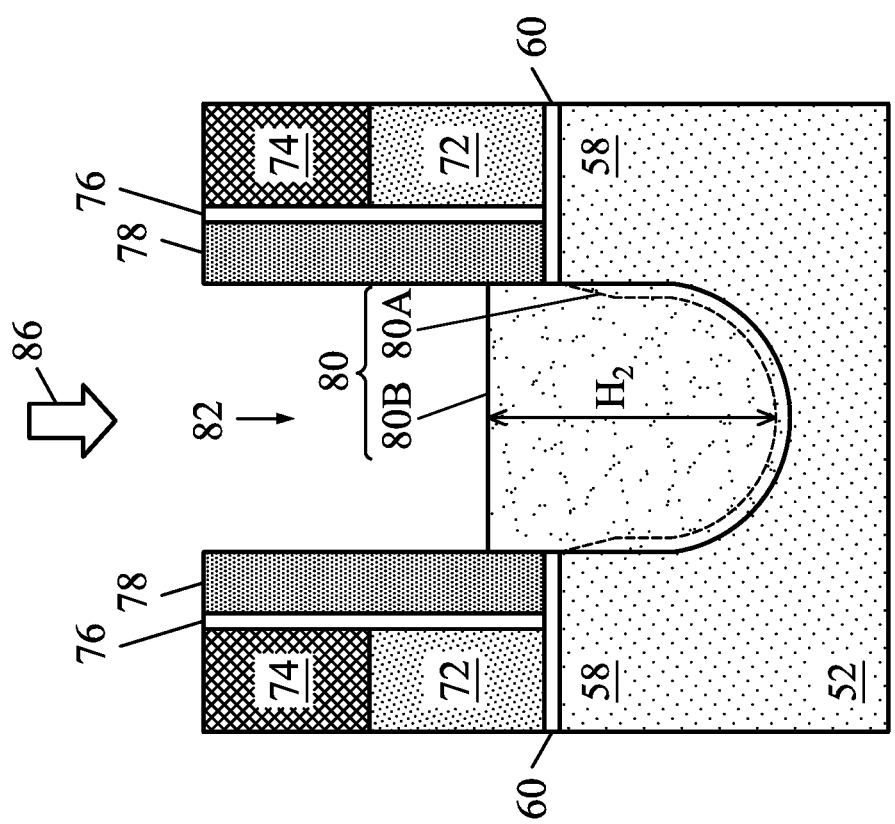
Figure 14:
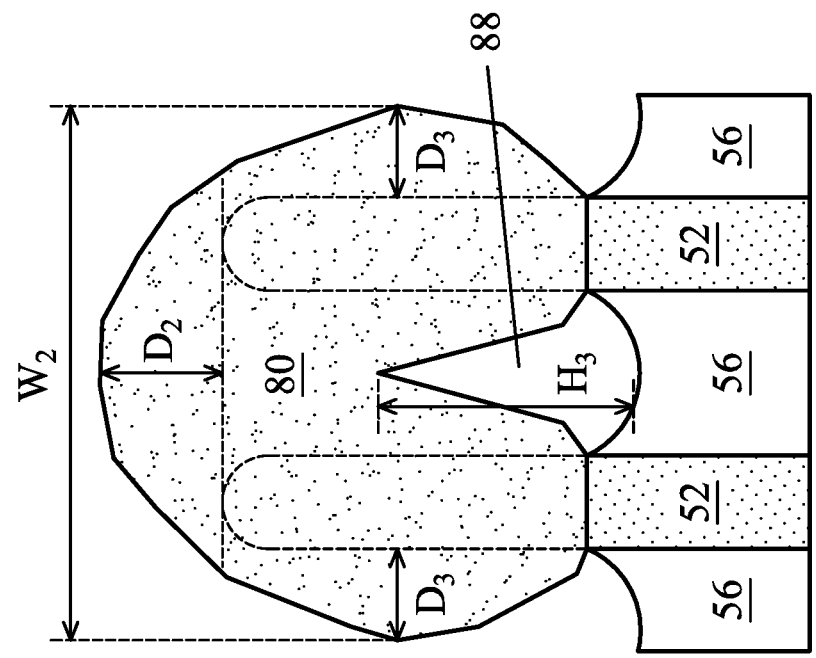

In FIG. 13, a second epitaxial growth process 86 is performed to form second layers 80B of the epitaxial source/drain regions 80 in the recesses 82. The second layers 80B fill the recesses 82, such that the resulting epitaxial source/drain regions 80 include the first layers 80A and the second layers 80B.

During the second epitaxial growth process 86, the recesses 82 are exposed to the same precursors as the first epitaxial growth process 84. As discussed further below, the precursor flow-rate ratios, temperature, and pressure during the second epitaxial growth process 86 are controlled to influence the material composition of the second layers 80B of the epitaxial source/drain regions 80. The second layers 80B are formed with a high dopant concentration. In some embodiments, the dopant concentration of the second layers 80B is in the range of from about $2*10^{21}$ cm$^{-3}$ to about $5*10^{21}$ cm$^{-3}$. Epitaxial regions of a high dopant concentration provide enough majority carriers for the resulting FinFETs.

The second epitaxial growth process 86 is performed so that the second layers 80B of the epitaxial source/drain regions 80 have a desired height $H_2$. For example, the second epitaxial growth process 86 may be performed for a second predetermined time period to produce layers of the desired height $H_2$. In some embodiments, a duration of the second epitaxial growth process 86 is in the range from about 50 seconds to about 500 seconds. The desired height $H_2$ is greater than the depth $D_1$ (see FIG. 11) such that top surfaces of the epitaxial source/drain regions 80 are above top surfaces of the fins 52. In some embodiments, the height $H_2$ is in the range of from about 30 nm to about 70 nm.

FIG. 14 illustrates one of the epitaxial source/drain regions 80 after formation. The epitaxial source/drain regions 80 have convex upper surfaces, which are raised from respective surfaces of the fins 52. Further, adjacent epitaxial source/drain regions 80 may merge so that the resulting epitaxial source/drain regions 80 span multiple fins 52 (e.g., a pair of fins 52 in the example shown), which are part of a same FinFET.

The epitaxial source/drain regions 80 have an overall width $W_2$. The overall width $W_2$ is determined by the material composition of the epitaxial source/drain regions 80. In accordance with some embodiments, the precursor flow-rate ratios, temperature, and pressure during the first epitaxial growth process 84 and/or the second epitaxial growth process 86 are controlled to reduce the overall width $W_2$ of the epitaxial source/drain regions 80. In some embodiments, the overall width $W_2$ is in the range of from about 50 nm to about 60 nm.

Topmost points (e.g., apexes) of the epitaxial source/drain regions 80 are raised an average distance $D_2$ above topmost points of the fins 52. In some embodiments, the distance $D_2$ less than about 15 nm, such as is in the range of from about 1 nm to about 15 nm. Further, sides of the epitaxial source/drain regions 80 extend an average distance $D_3$ from the closest ones of the fins 52. In some embodiments, the distance $D_3$ is in the range of less than about 30 nm. The shape profile of the epitaxial source/drain regions 80 may be expressed as the ratio of the distance $D_2$ to the distance $D_3$. The ratio of the distance $D_2$ to the distance $D_3$ is also determined by the material composition of the epitaxial source/drain regions 80. In accordance with some embodiments, the precursor flow-rate ratios, temperature, and pressure during the first epitaxial growth process 84 and/or the second epitaxial growth process 86 are controlled to increase the ratio of the distance $D_2$ to the distance $D_3$. In some embodiments, the ratio of the distance $D_2$ to the distance $D_3$ is in the range of from about 0.5 to about 6.

Air gaps 88 are formed beneath the epitaxial source/drain regions 80, between neighboring pairs of the fins 52. In some embodiments, the isolation regions 56 have convex upper surfaces. The air gaps 88 have an average height $H_3$ extending from the convex upper surface of the isolation region 56 between the pairs of fins 52. The height $H_3$ is also determined by the material composition of the epitaxial source/drain regions 80. In accordance with some embodiments, the precursor flow-rate ratios, temperature, and pressure during the first epitaxial growth process 84 and/or the second epitaxial growth process 86 are controlled to increase the height $H_3$. In some embodiments, the height $H_3$ is in the range of from about 15 nm to about 40 nm.

The overall width $W_2$, the ratio of $D_2$ to $D_3$, and the height $H_3$ of the epitaxial source/drain regions 80 all depend on the precursor flow-rate ratios during the first epitaxial growth process 84 and the second epitaxial growth process 86. The precursor flow-rate ratios may be quantified according to:

$$\Gamma = \frac{N_{Si} + N_H}{N_{Cl}}, \quad (1)$$

where $N_{Si}$ is the total number of gas-phase silicon atoms bonded to gas-phase hydrogen atoms or gas-phase chlorine atoms in the dispensed precursors, $N_H$ is the total number of gas-phase hydrogen atoms bonded to gas-phase silicon atoms or gas-phase chlorine atoms in the dispensed precursors, $N_{Cl}$ is the total number of gas-phase chlorine atoms bonded to gas-phase silicon atoms or gas-phase hydrogen atoms in the dispensed precursors, and $\Gamma$ is a unitless quantification of the predicted shape of the grown epitaxial layers. Epitaxial growth processes with a high predicted shape value $\Gamma$ will produce epitaxial source/drain regions 80 a lesser width $W_2$, a greater ratio of $D_2$ to $D_3$, and a greater height $H_3$.

The ratio of $D_2$ to $D_3$ has a lower and upper constraint. In particular, when the ratio of $D_2$ to $D_3$ is too small, the epitaxial source/drain regions 80 form facets, and do not have convex upper surfaces. Likewise, when the ratio of $D_2$ to $D_3$ is too large, the epitaxial source/drain regions 80 may have insufficient adhesion to sides of the fins 52. As such, in some embodiments, the ratio of $D_2$ to $D_3$ is constrained to being in the range of from about 0.5 to about 6, which allows the epitaxial source/drain regions 80 to have a desired shape and sufficient fin adhesion. In such embodiments, the epitaxial source/drain regions 80 are grown with growth processes having a predicted shape value $\Gamma$ in the range of from about 1.75 to about 7.1, which allows the ratio of $D_2$ to $D_3$ to be in the range of from about 0.5 to about 6.

The predicted shape value $\Gamma$ of the first epitaxial growth process 84 and the second epitaxial growth process 86 is controlled by selecting the precursor flow-rate ratios during the growth processes. In some embodiments, the predicted shape value $\Gamma$ of the first epitaxial growth process 84 is different from the predicted shape value $\Gamma$ of the second epitaxial growth process 86. In particular, the precursors are dispensed at first flow rates during the first epitaxial growth process 84, and the same precursors are dispensed at second flow rates during the second epitaxial growth process 86. The precursor flow-rate ratios during the second epitaxial growth process 86 are different than the precursor flow-rate ratios during the first epitaxial growth process 84. As noted above, in some embodiments, the semiconductor material precursors are silane, DCS, and TCS. Performing the second epitaxial growth process 86 may thus include changing the flow rates of the silane, DCS, and TCS. In some embodiments, the flow rate of silane is increased, the flow rate of DCS is decreased, and the flow rate of TCS is optionally decreased. As noted above, the predicted shape value Γ of an epitaxial growth process is inversely proportional to the total number of gas-phase chlorine atoms bonded to gas-phase hydrogen atoms or gas-phase silicon atoms in the dispensed precursors. By decreasing the flow rates of DCS (and optionally TCS), less chlorine is introduced during the second epitaxial growth process 86, increasing the predicted shape value Γ during formation of the second layers 80B of the epitaxial source/drain regions 80. Thus, the predicted shape value Γ during formation of the second layers 80B is greater than that during formation of the first layers 80A.

In some embodiments, the dopant precursor flow-rate during the first epitaxial growth process 84 is less than the dopant precursor flow-rate during the second epitaxial growth process 86. As noted above, in some embodiments, the dopant precursor may be, e.g., phosphine (for p-type devices) or diborane (for n-type devices). Performing the second epitaxial growth process 86 may thus include increasing the flow rate of the phosphine or arsine.

In some embodiments, the etching precursor flow-rate during the first epitaxial growth process 84 is less than the etching precursor flow-rate during the second epitaxial growth process 86. As noted above, in some embodiments, the etching precursor is hydrochloric acid. Performing the second epitaxial growth process 86 may thus include increasing the flow rate of the hydrochloric acid.

The first layers 80A of the epitaxial source/drain regions 80 are thinner than the second layers 80B. As such, the precursor flow-rates during the second epitaxial growth process 86 influence the predicted shape value Γ more than the precursor flow-rates during the first epitaxial growth process 84. Table 1 shows data from an epitaxial growth experiment. Several epitaxial regions were grown, with the precursor flow rates listed in Table 1 being used during the second epitaxial growth process 86. The precursor flow rates are given in sccm. The predicted shape value Γ of the epitaxial growth experiment was largely unaffected by the dopant precursor concentration, and so the dopant precursor flow rate was not adjusted or measured in the experiments. The ratio of $D_2$ to $D_3$ for the grown epitaxial regions are shown in Table 1.

TABLE 1

| Silane | DCS | TCS | HCl | Γ | $D_2:D_3$ |
|---|---|---|---|---|---|
| 2.13 | 40.00 | 1.00 | 20.00 | 1.48 | 0.07 |
| 1.00 | 20.00 | 0.00 | 8.33 | 1.52 | 0.27 |
| 1.00 | 4.00 | 0.00 | 4.00 | 1.75 | 0.5 |
| 5.00 | 10.00 | 1.00 | 9.60 | 2.04 | 0.80 |

As illustrated by Table 1, a Silane:DCS:TCS:HCl flow-rate ratio of 5:10:1:9.6 resulted in the epitaxial growth process having a predicted shape value Γ of 2.04, allowing the ratio of $D_2$ to $D_3$ of the resulting epitaxial source/drain regions 80 to be in the desired range.

The ratio of $D_2$ to $D_3$ of the resulting epitaxial source/drain regions 80 is also controlled by selecting the temperature and pressure during the first epitaxial growth process 84 and the second epitaxial growth process 86. The first epitaxial growth process 84 and second epitaxial growth process 86 may be performed at different processing temperatures and pressures. The first epitaxial growth process 84 may be performed at a high temperature, such as a temperature in the range of from about 400° C. to about 800° C., and at a low pressure, such as a pressure in the range of from about 5 Torr to about 600 Torr. The second epitaxial growth process 86 may be performed at a high temperature, such as a temperature in the range of from about 450° C. to about 800° C., and at a low pressure, such as a pressure in the range of from about 5 Torr to about 600 Torr. Performing the first epitaxial growth process 84 and second epitaxial growth process 86 with a high temperature and a low pressure allows the ratio of $D_2$ to $D_3$ to be increased.

After the first epitaxial growth process 84 and second epitaxial growth process 86 are completed, the epitaxial source/drain regions 80 have a more slender shape profile (e.g., a greater ratio of $D_2$ to $D_3$). Further, the average height $H_3$ of the air gaps 88 may be reduced, and the overall width $W_2$ of the epitaxial source/drain regions 80 may be decreased. By decreasing the overall width $W_2$, the gate-to-source/drain capacitance in the resulting FinFETs may be decreased. Performance of the resulting FinFETs is thus increased.

Figure 15B:
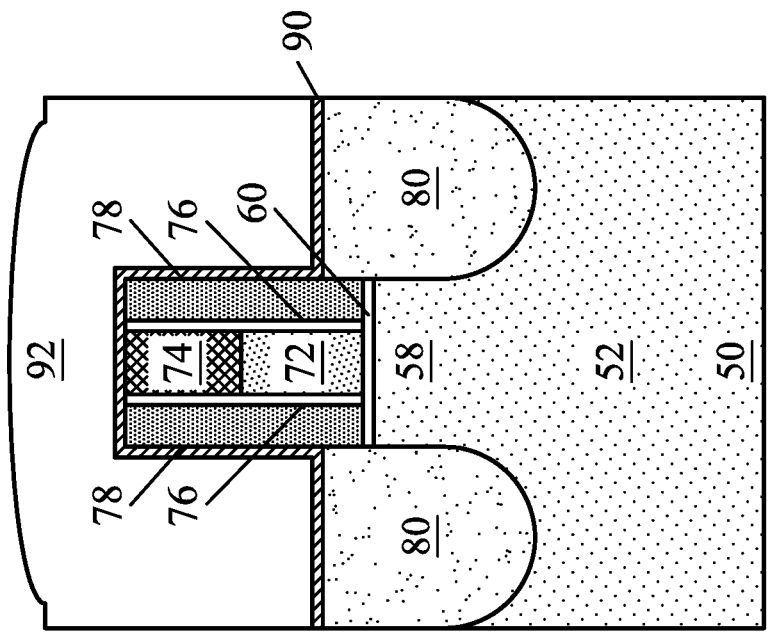
Figure 15A:
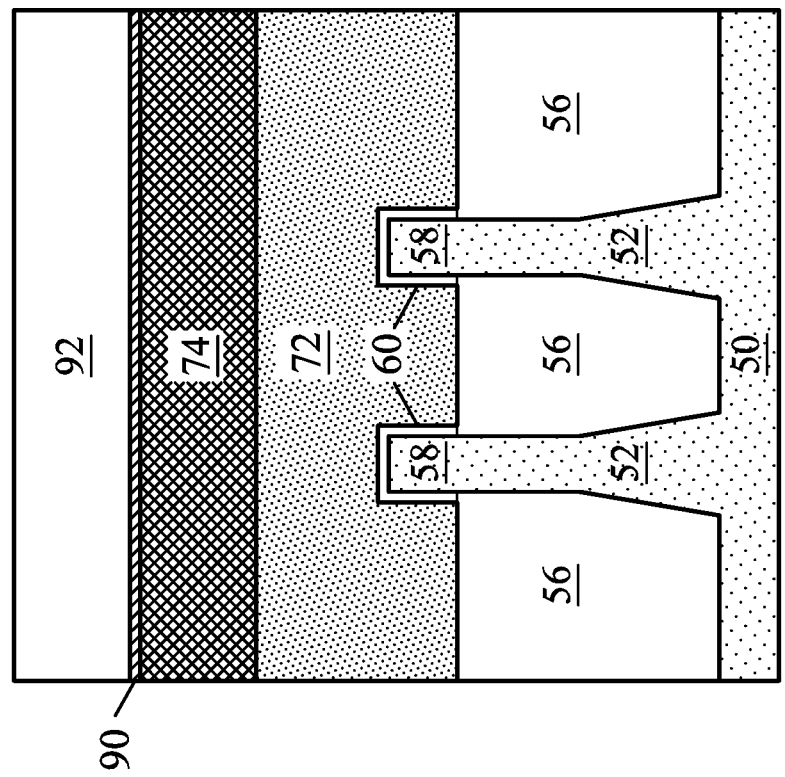

In FIGS. 15A and 15B, a first ILD 92 is deposited over the intermediate structure. The first ILD 92 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 90 is disposed between the first ILD 92 and the epitaxial source/drain regions 80, the masks 74, and the gate spacers 78. The CESL 90 may comprise a dielectric material, such as, silicon nitride, silicon oxide, silicon oxynitride, or the like, having a different etch rate than the material of the overlying first ILD 92.

Figure 16B:
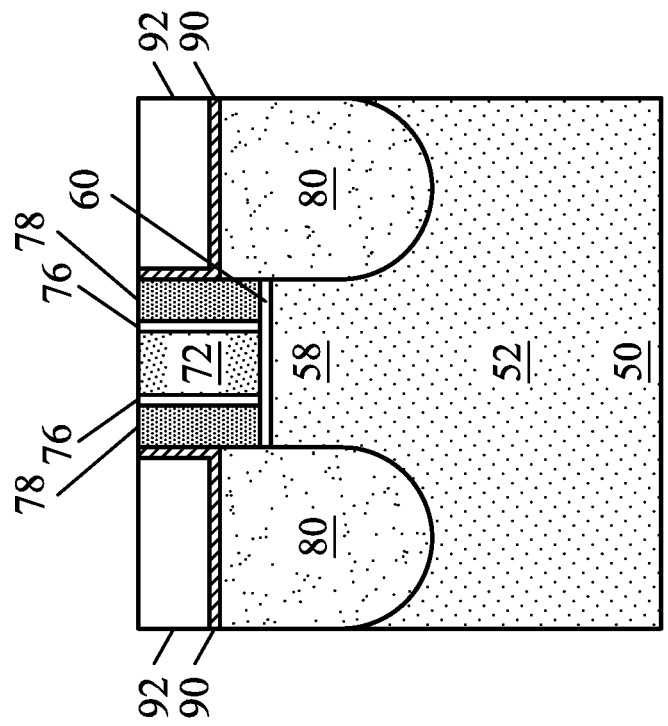
Figure 16A:
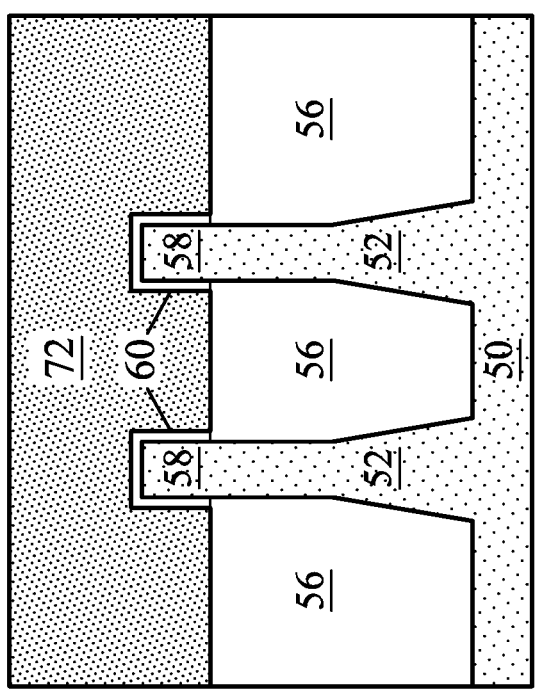

In FIGS. 16A and 16B, a planarization process, such as a CMP, may be performed to level the top surface of the first ILD 92 with the top surfaces of the dummy gates 72 or the masks 74. The planarization process may also remove the masks 74 on the dummy gates 72, and portions of the gate seal spacers 76 and the gate spacers 78 along sidewalls of the masks 74. After the planarization process, top surfaces of the dummy gates 72, the gate seal spacers 76, the gate spacers 78, and the first ILD 92 are level. Accordingly, the top surfaces of the dummy gates 72 are exposed through the first ILD 92. In some embodiments, the masks 74 may remain, in which case the planarization process levels the top surface of the first ILD 92 with the top surfaces of the top surface of the masks 74.

Figure 17B:
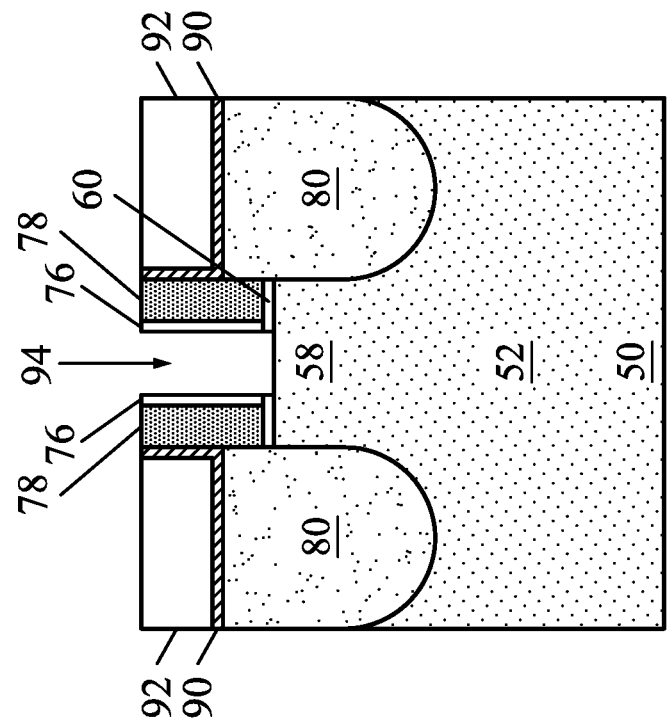
Figure 17A:
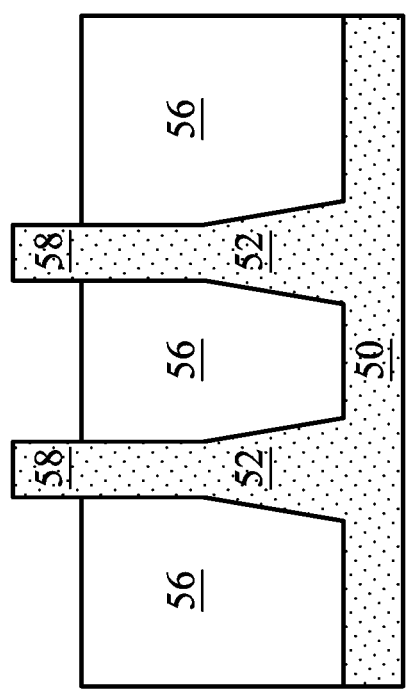

In FIGS. 17A and 17B, the dummy gates 72, and the masks 74 if present, are removed in an etching step(s), so that recesses 94 are formed. Portions of the dummy dielectric layer 60 in the recesses 94 may also be removed. In some embodiments, only the dummy gates 72 are removed and the dummy dielectric layer 60 remains and is exposed by the recesses 94. In some embodiments, the dummy dielectric layer 60 is removed from recesses 94 in a first region of a die (e.g., a core logic region) and remains in recesses 94 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 92 or the gate spacers 78. Each recess 94 exposes a channel region 58 of a respective fin 52. Each channel region 58 is disposed between neighboring pairs of the epitaxial source/drain regions 80. During the removal, the dummy dielectric layer 60 may be used as an etch stop layer when the dummy gates 72 are etched. The dummy dielectric layer 60 may then be optionally removed after the removal of the dummy gates 72.

Figure 18B:
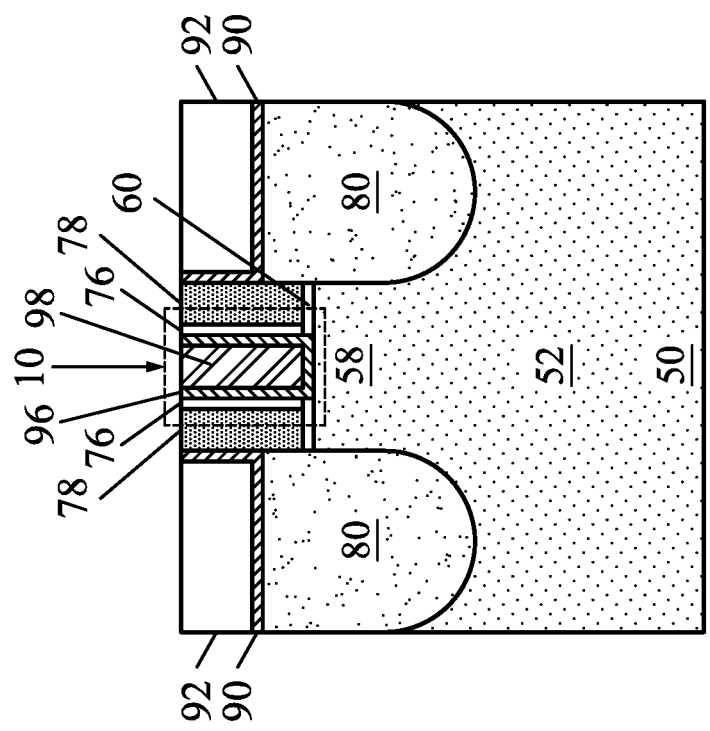
Figure 18A:
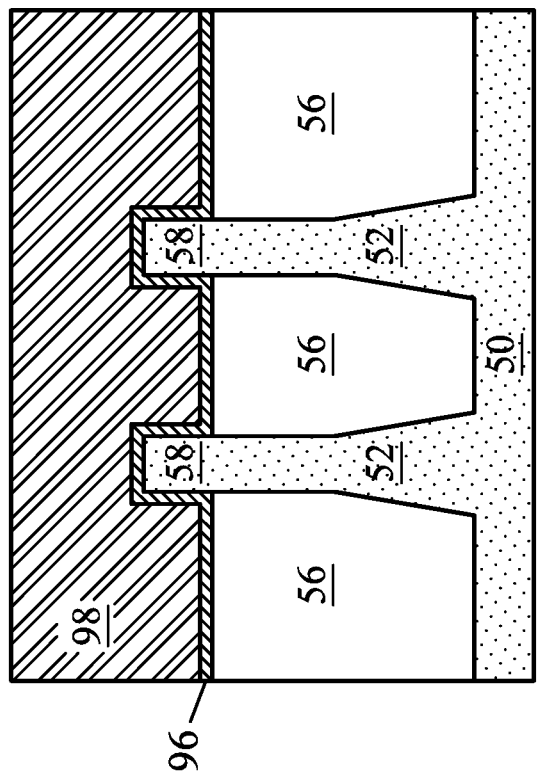
Figure 18C:
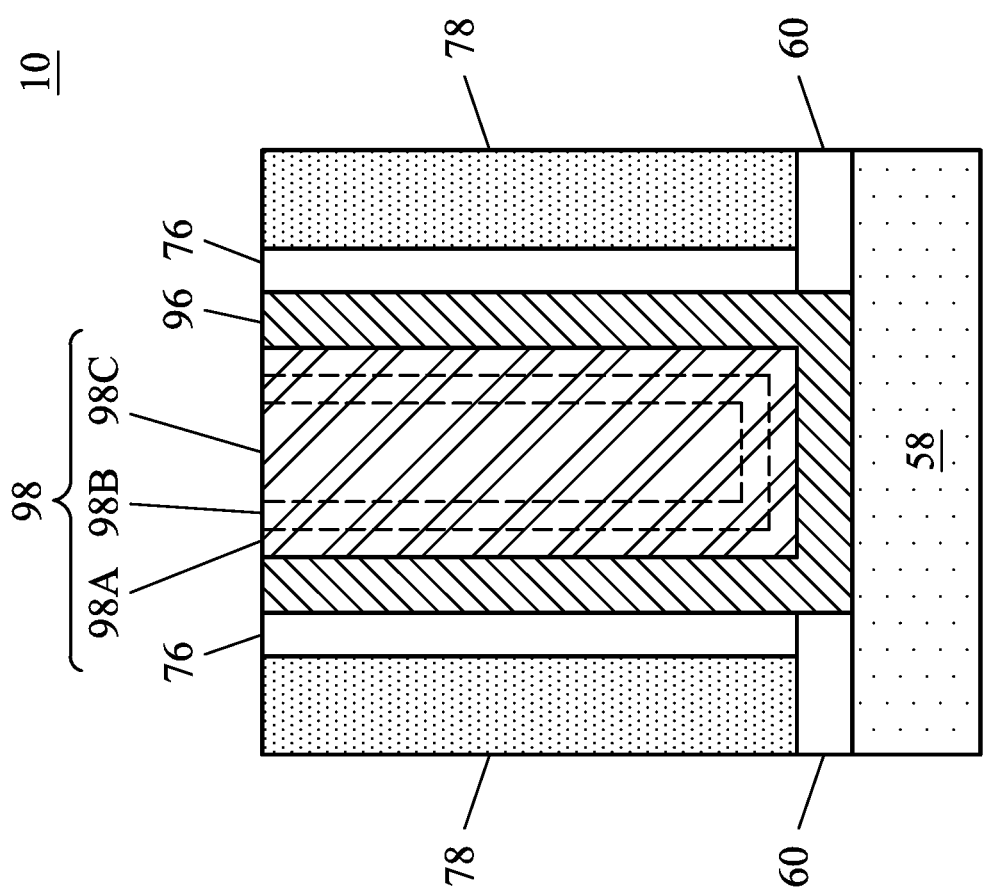

In FIGS. 18A and 18B, gate dielectric layers 96 and gate electrodes 98 are formed for replacement gates. FIG. 18C illustrates a detailed view of region 10 of FIG. 18B. Gate dielectric layers 96 are deposited conformally in the recesses 94, such as on the top surfaces and the sidewalls of the fins 52 and on sidewalls of the gate seal spacers 76/gate spacers 78. The gate dielectric layers 96 may also be formed on top surface of the first ILD 92. In accordance with some embodiments, the gate dielectric layers 96 comprise silicon oxide, silicon nitride, or multilayers thereof. In some embodiments, the gate dielectric layers 96 include a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of the gate dielectric layers 96 may include Molecular-Beam Deposition (MBD), ALD, PECVD, and the like. In embodiments where portions of the dummy gate dielectric layer 60 remain in the recesses 94, the gate dielectric layers 96 include a material of the dummy gate dielectric layer 60 (e.g., $SiO_2$).

The gate electrodes 98 are deposited over the gate dielectric layers 96, respectively, and fill the remaining portions of the recesses 94. The gate electrodes 98 may include a metal-containing material such as TiN, TiO, TaN, TaC, Co, Ru, Al, W, combinations thereof, or multi-layers thereof. For example, although a single layer gate electrode 98 is illustrated in FIG. 18B, the gate electrode 98 may comprise any number of liner layers 98A, any number of work function tuning layers 98B, and a fill material 98C as illustrated by FIG. 18C. After the filling of the gate electrodes 98, a planarization process, such as a CMP, may be performed to remove the excess portions of the gate dielectric layers 96 and the material of the gate electrodes 98, which excess portions are over the top surface of the first ILD 92. The remaining portions of material of the gate electrodes 98 and the gate dielectric layers 96 thus form replacement gates of the resulting FinFETs. The gate electrodes 98 and the gate dielectric layers 96 may be collectively referred to as a "gate stack." The gate and the gate stacks may extend along sidewalls of a channel region 58 of the fins 52.

The formation of the gate dielectric layers 96 in the region 50N and the region 50P may occur simultaneously such that the gate dielectric layers 96 in each region are formed from the same materials, and the formation of the gate electrodes 98 may occur simultaneously such that the gate electrodes 98 in each region are formed from the same materials. In some embodiments, the gate dielectric layers 96 in each region may be formed by distinct processes, such that the gate dielectric layers 96 may be different materials, and/or the gate electrodes 98 in each region may be formed by distinct processes, such that the gate electrodes 98 may be different materials. Various masking steps may be used to mask and expose appropriate regions when using distinct processes.

Figure 19B:
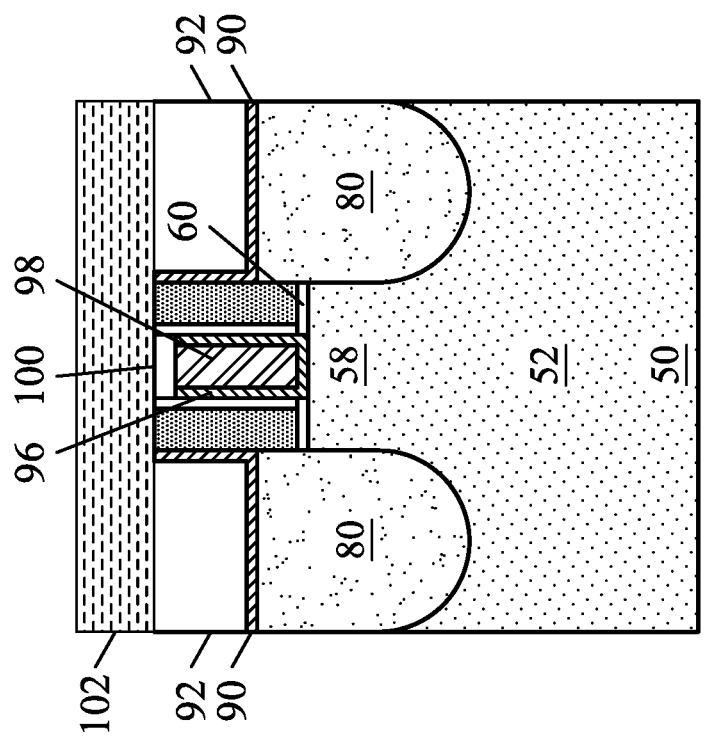
Figure 19A:
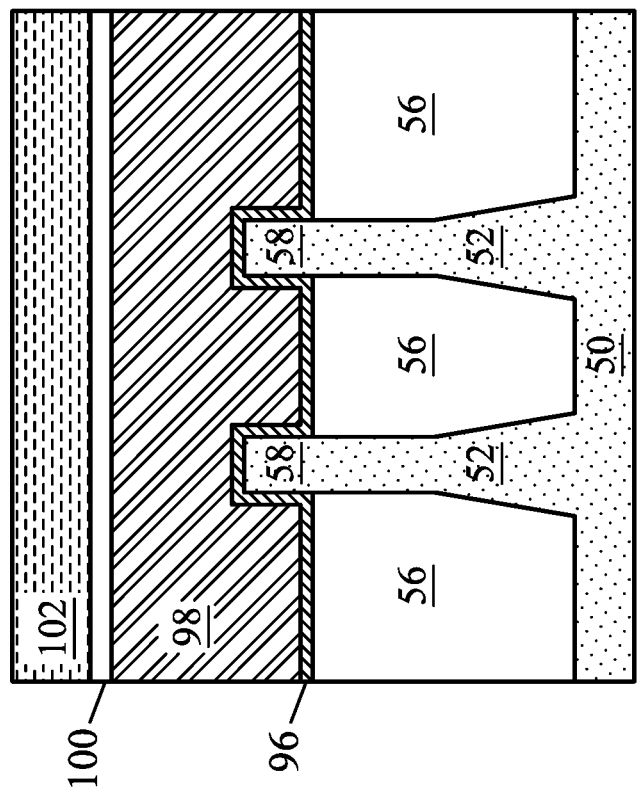

In FIGS. 19A and 19B, a second ILD 102 is deposited over the first ILD 92. In some embodiment, the second ILD 102 is a flowable film formed by a flowable CVD method. In some embodiments, the second ILD 102 is formed of a dielectric material such as PSG, BSG, BPSG, USG, or the like, and may be deposited by any suitable method, such as CVD and PECVD. In accordance with some embodiments, before the formation of the second ILD 102, the gate stack (including a gate dielectric layer 96 and a corresponding overlying gate electrode 98) is recessed, so that a recess is formed directly over the gate stack and between opposing portions of gate spacers 78, as illustrated in FIGS. 19A and 19B. A gate mask 100 comprising one or more layers of dielectric material, such as silicon nitride, silicon oxynitride, or the like, is filled in the recess, followed by a planarization process to remove excess portions of the dielectric material extending over the first ILD 92. The subsequently formed gate contacts 104 (FIGS. 20A and 20B) penetrate through the gate mask 100 to contact the top surface of the recessed gate electrode 98.

Figure 20B:
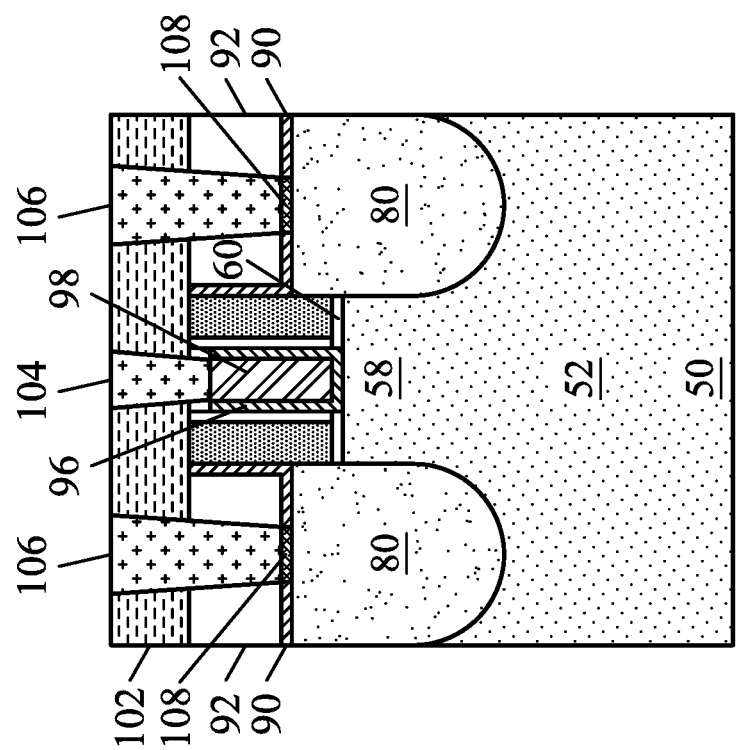
Figure 20A:
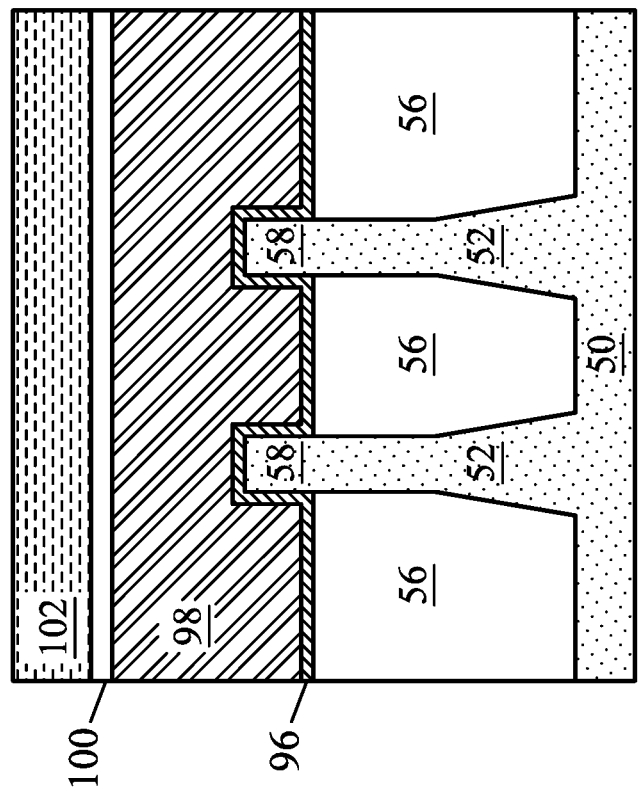

In FIGS. 20A and 20B, gate contacts 104 and source/drain contacts 106 are formed through the second ILD 102 and the first ILD 92 in accordance with some embodiments. Openings for the source/drain contacts 106 are formed through the first ILD 92 and the second ILD 102, and openings for the gate contact 104 are formed through the second ILD 102 and the gate mask 100. The openings may be formed using acceptable photolithography and etching techniques. The openings for the source/drain contacts 106 may have any depth, and in some embodiments, have a depth in the range of from about 5 nm to about 15 nm.

A silicide 108 may be formed on the epitaxial source/drain regions 80. In some embodiments, a conductive material is deposited on the epitaxial source/drain regions 80 (e.g., in the openings for the source/drain contacts 106) before the source/drain contacts 106 are formed. The conductive material may be titanium, cobalt, nickel, or the like, and may be a different conductive material than that of the source/drain contacts 106. The conductive material is annealed to form the silicide 108. The silicide 108 is physically and electrically coupled to the epitaxial source/drain regions 80. In some embodiments, the silicide 108 has a thickness in the range of from about 2 nm to about 20 nm.

A liner, such as a diffusion barrier layer, an adhesion layer, or the like, and a conductive material are then formed in the openings and on the silicide 108. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 102. The remaining liner and conductive material form the source/drain contacts 106 and gate contacts 104 in the openings. The source/drain contacts 106 are physically and electrically coupled to the silicide 108, and the gate contacts 104 are physically and electrically coupled to the gate electrodes 98. The source/drain contacts 106 and gate contacts 104 may be formed in different processes, or may be formed in the same process. Although shown as being formed in the same cross-sections, it should be appreciated that each of the source/drain contacts 106 and gate contacts 104 may be formed in different cross-sections, which may avoid shorting of the contacts.

Embodiments may achieve advantages. By changing the semiconductor material precursor flow rates during the second epitaxial growth process 86, the predicted shape value Γ of the second epitaxial growth process 86 may be increased. Decreasing the total amount of gas-phase chlorine atoms during the second epitaxial growth process 86 allows the resulting epitaxial source/drain regions 80 to have a more slender shape profile, and a lower overall width. By decreasing the overall width, the gate-to-source/drain capacitance in the resulting FinFETs may be decreased. A decreased gate-to-source/drain capacitance may be particularly advantageous in some applications of the resulting FinFETs, such as ring oscillators.

In an embodiment, A method including: forming a gate stack on a fin; etching the fin to form a recess in the fin adjacent the gate stack; dispensing a plurality of silicon precursors during a first growth process to form a first layer of an epitaxial source/drain region in the recess, the plurality of silicon precursors being dispensed during the first growth process at flow rates having a first set of flow-rate ratios; and dispensing the plurality of silicon precursors during a second growth process to form a second layer of the epitaxial source/drain region on the first layer of the epitaxial source/drain region, the plurality of silicon precursors being dispensed during the second growth process at flow rates having a second set of flow-rate ratios, the second set of flow-rate ratios being different than the first set of flow-rate ratios, where the silicon precursors of the first growth process have a first ratio of a sum of a quantity of bonded gas-phase silicon atoms and a quantity of bonded gas-phase hydrogen atoms to a quantity of bonded gas-phase chlorine atoms, and where the silicon precursors of the second growth process have a second ratio of a sum of a quantity of bonded gas-phase silicon atoms and a quantity of bonded gas-phase hydrogen atoms to a quantity of bonded gas-phase chlorine atoms, the second ratio being greater than the first ratio.

In some embodiments of the method, the second ratio is from about 1.75 to about 7.1. In some embodiments of the method, the silicon precursors are silane, dichlorosilane, and trichlorosilane. In some embodiments of the method, the flow rate of silane during the second growth process is greater than the flow rate of silane during the first growth process. In some embodiments of the method, the flow rate of the dichlorosilane during the second growth process is less than the flow rate of the dichlorosilane during the first growth process. In some embodiments of the method, the flow rate of the trichlorosilane during the second growth process is less than the flow rate of the trichlorosilane during the first growth process. In some embodiments of the method, the flow rate of the trichlorosilane during the second growth process is equal to the flow rate of the trichlorosilane during the first growth process. In some embodiments of the method, the first growth process is performed at a temperature of from about 400° C. to about 800° C., and at a pressure of from about 5 Torr to about 600 Torr. In some embodiments of the method, the second growth process is performed at a temperature of from about 450° C. to about 800° C., and at a pressure of from about 5 Torr to about 600 Torr. In some embodiments of the method, the first growth process further includes: dispensing a dopant precursor and an etching precursor to form the first layer of the epitaxial source/drain region in the recess. In some embodiments of the method, the second growth process further includes: dispensing the dopant precursor and the etching precursor to form the second layer of the epitaxial source/drain region on the first layer of the epitaxial source/drain region, where the dopant precursor is dispensed at a greater flow rate during the second growth process than during the first growth process, and where the etching precursor is dispensed at a greater flow rate during the second growth process than during the first growth process.

In an embodiment, A method including: forming a first gate stack and a second gate stack on a fin; etching the fin to form a recess in the fin between the first gate stack and the second gate stack; forming an epitaxial source/drain region in the recess, the forming including: growing a first layer lining sides and a bottom of the recess by dispensing silane, dichlorosilane, trichlorosilane, and hydrochloric acid in the recess; and after growing the first layer, growing a second layer on the first layer by dispensing the silane, dichlorosilane, trichlorosilane, and hydrochloric acid in the recess, where each of the silane, dichlorosilane, trichlorosilane, and hydrochloric acid are dispensed at a first flow rate when growing the first layer and at a second flow rate when growing the second layer.

In some embodiments of the method, the silane, dichlorosilane, trichlorosilane, and hydrochloric acid are dispensed, respectively, at a ratio of 5:10:1:9.6 when growing the second layer. In some embodiments of the method, growing the first layer includes dispensing the silane, dichlorosilane, trichlorosilane, and hydrochloric acid at a first ratio of a sum of a quantity of bonded gas-phase silicon atoms and a quantity of bonded gas-phase hydrogen atoms to a quantity of bonded gas-phase chlorine atoms, growing the second layer includes dispensing the silane, dichlorosilane, trichlorosilane, and hydrochloric acid at a second ratio of a sum of a quantity of bonded gas-phase silicon atoms and a quantity of bonded gas-phase hydrogen atoms to a quantity of bonded gas-phase chlorine atoms, and the second ratio is greater than the first ratio. In some embodiments of the method, growing the first layer is performed at a temperature of from about 400° C. to about 800° C., and at a pressure of from about 5 Torr to about 600 Torr. In some embodiments of the method, growing the second layer is performed at a temperature of from about 450° C. to about 800° C., and at a pressure of from about 5 Torr to about 600 Torr. In some embodiments of the method, the first flow rate of the silane is less than the second flow rate of the silane, the first flow rate of the dichlorosilane is greater than the second flow rate of the dichlorosilane, the first flow rate of the trichlorosilane is greater than the second flow rate of the trichlorosilane, and the first flow rate of the hydrochloric acid is greater than the second flow rate of the hydrochloric acid.

In an embodiment, A device including: a first fin and a second fin extending from a substrate; a source/drain region in the first fin and the second fin, sides of the source/drain region being disposed an average first distance from sides of the first and second fins, the source/drain region including: a first layer having a first dopant concentration; and a second layer on the first layer, the second layer having a second dopant concentration, the second dopant concentration being greater than the first dopant concentration, the second layer having a convex top surface, the convex top surface being disposed an average second distance from tops of the first and second fins, where a second ratio of the second distance to the first distance is from about 0.5 to about 6.

In some embodiments of the device, the second distance is from about 1 nm to about 15 nm. In some embodiments of the device, the first layer has a first portion extending along sides of the second layer, and a second portion extending along a bottom of the second layer, the first portion having a first thickness of from about 1 nm to about 8 nm, the second portion having a second thickness of from about 1 nm to about 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate stack on a fin;
   etching the fin to form a recess in the fin adjacent the gate stack;
   dispensing a plurality of silicon precursors during a first growth process to form a first layer of an epitaxial source/drain region in the recess, the plurality of silicon precursors being dispensed during the first growth process at flow rates having a first set of flow-rate ratios; and
   dispensing the plurality of silicon precursors during a second growth process to form a second layer of the epitaxial source/drain region on the first layer of the epitaxial source/drain region, the plurality of silicon precursors being dispensed during the second growth process at flow rates having a second set of flow-rate ratios, the second set of flow-rate ratios being different than the first set of flow-rate ratios,
   wherein the silicon precursors of the first growth process have a first ratio of a sum of a quantity of bonded gas-phase silicon atoms and a quantity of bonded gas-phase hydrogen atoms to a quantity of bonded gas-phase chlorine atoms, and
   wherein the silicon precursors of the second growth process have a second ratio of a sum of a quantity of bonded gas-phase silicon atoms and a quantity of bonded gas-phase hydrogen atoms to a quantity of bonded gas-phase chlorine atoms, the second ratio being greater than the first ratio.

2. The method of claim 1, wherein the second ratio is from 1.75 to 7.1.

3. The method of claim 1, wherein the silicon precursors are silane, dichlorosilane, and trichlorosilane.

4. The method of claim 3, where the flow rate of silane during the second growth process is greater than the flow rate of silane during the first growth process.

5. The method of claim 3, where the flow rate of the dichlorosilane during the second growth process is less than the flow rate of the dichlorosilane during the first growth process.

6. The method of claim 3, where the flow rate of the trichlorosilane during the second growth process is less than the flow rate of the trichlorosilane during the first growth process.

7. The method of claim 3, where the flow rate of the trichlorosilane during the second growth process is equal to the flow rate of the trichlorosilane during the first growth process.

8. The method of claim 1, wherein the first growth process is performed at a temperature of from 400° C. to 800° C., and at a pressure of from 5 Torr to 600 Torr.

9. The method of claim 1, wherein the second growth process is performed at a temperature of from 450° C. to 800° C., and at a pressure of from 5 Torr to 600 Torr.

10. The method of claim 1, wherein the first growth process further comprises:
    dispensing a dopant precursor and an etching precursor to form the first layer of the epitaxial source/drain region in the recess.

11. The method of claim 10, wherein the second growth process further comprises:
    dispensing the dopant precursor and the etching precursor to form the second layer of the epitaxial source/drain region on the first layer of the epitaxial source/drain region, where the dopant precursor is dispensed at a greater flow rate during the second growth process than during the first growth process, and wherein the etching precursor is dispensed at a greater flow rate during the second growth process than during the first growth process.

12. A method comprising:
    forming a first gate stack and a second gate stack on a fin;
    etching the fin to form a recess in the fin between the first gate stack and the second gate stack;
    forming an epitaxial source/drain region in the recess, the forming comprising:
      growing a first layer lining sides and a bottom of the recess by dispensing silane, dichlorosilane, trichlorosilane, and hydrochloric acid in the recess; and
      after growing the first layer, growing a second layer on the first layer by dispensing the silane, dichlorosilane, trichlorosilane, and hydrochloric acid in the recess,
      wherein each of the silane, dichlorosilane, trichlorosilane, and hydrochloric acid are dispensed at a first flow rate when growing the first layer and at a second flow rate when growing the second layer.

13. The method of claim 12, wherein the silane, dichlorosilane, trichlorosilane, and hydrochloric acid are dispensed, respectively, at a ratio of 5:10:1:9.6 when growing the second layer.

14. The method of claim 12, wherein growing the first layer comprises dispensing the silane, dichlorosilane, trichlorosilane, and hydrochloric acid at a first ratio of a sum of a quantity of bonded gas-phase silicon atoms and a quantity of bonded gas-phase hydrogen atoms to a quantity of bonded gas-phase chlorine atoms, wherein growing the second layer comprises dispensing the silane, dichlorosilane, trichlorosilane, and hydrochloric acid at a second ratio of a sum of a quantity of bonded gas-phase silicon atoms and a quantity of bonded gas-phase hydrogen atoms to a quantity of bonded gas-phase chlorine atoms, and wherein the second ratio is greater than the first ratio.

15. The method of claim 12, wherein growing the first layer is performed at a temperature of from 400° C. to 800° C., and at a pressure of from 5 Torr to 600 Torr.

16. The method of claim 15, wherein growing the second layer is performed at a temperature of from 450° C. to 800° C., and at a pressure of from 5 Torr to 600 Torr.

17. The method of claim 12, wherein the first flow rate of the silane is less than the second flow rate of the silane, the first flow rate of the dichlorosilane is greater than the second flow rate of the dichlorosilane, the first flow rate of the trichlorosilane is greater than the second flow rate of the trichlorosilane, and the first flow rate of the hydrochloric acid is greater than the second flow rate of the hydrochloric acid.

18. A method comprising:
    forming a first gate stack and a second gate stack on a fin;
    etching the fin to form a recess in the fin between the first gate stack and the second gate stack;
    performing a first growth process to form a first layer of an epitaxial source/drain region in the recess, the first growth process comprising dispensing a plurality of precursors for a first duration, the plurality of precursors comprising silane, dichlorosilane, trichlorosilane, phosphine or diborane, and hydrochloric acid; and
    performing a second growth process to form a second layer of the epitaxial source/drain region on the first layer of the epitaxial source/drain region, the second growth process comprising dispensing the plurality of precursors for a second duration,
wherein the silane is dispensed at a greater flow rate during the second growth process than during the first growth process, the dichlorosilane is dispensed at a lesser flow rate during the second growth process than during the first growth process, the phosphine or diborane is dispensed at a greater flow rate during the second growth process than during the first growth process, and the hydrochloric acid is dispensed at a greater flow rate during the second growth process than during the first growth process.

19. The method of claim 18, wherein the trichlorosilane is dispensed at a lesser flow rate during the second growth process than during the first growth process.

20. The method of claim 18, wherein the second duration is greater than the first duration.

* * * * *